United States Patent [19]

Fiori, Jr.

[11] Patent Number: 5,664,022
[45] Date of Patent: Sep. 2, 1997

[54] NOISE GATE CONTROL CIRCUITRY FOR ELECTRONIC SYSTEMS

[76] Inventor: David Fiori, Jr., P.O. Box 266, Yardley, Pa. 19067

[21] Appl. No.: 178,099

[22] Filed: Jan. 6, 1994

[51] Int. Cl.⁶ ................................................. G01R 31/02
[52] U.S. Cl. ................................. 381/94.1; 381/107
[58] Field of Search .................... 381/94, 107; 324/67

[56] References Cited

U.S. PATENT DOCUMENTS

| | | | |
|---|---|---|---|
| 4,203,073 | 5/1980 | Rae et al. | 455/311 |
| 4,405,948 | 9/1983 | Griffis | 381/107 |
| 4,491,785 | 1/1985 | Pecukonis | 324/67 |
| 4,642,556 | 2/1987 | Pecukonis | 324/67 |
| 4,747,783 | 5/1988 | Bellamy et al. | 439/59 |
| 5,045,774 | 9/1991 | Bromberg | 323/322 |
| 5,235,629 | 8/1993 | Butler et al. | 379/21 |
| 5,334,947 | 8/1994 | Werrbach | 330/149 |

OTHER PUBLICATIONS

Video Ed/it 2 Manual ©1990.

*Primary Examiner*—Stephen Brinich
*Attorney, Agent, or Firm*—Dilworth & Barrese

[57] ABSTRACT

Noise gate control circuitry eliminates in audio systems the effects of spurious signals on a transducer of a speaker. The noise gate control circuitry coordinates the electronic switching of the transducer to power sources in accordance with a remote turn on control signal, and coordinates this action with the application of power to power sources and signal processing circuitry via remote turn on provisions. The noise gate control circuitry senses and responds to the signals and rapidly connects and disconnects the transducer when the signal level drops to a level too low to be of any good effect. The effect of signal level on delays is removed to provide for suppressing undesirable changes in response.

31 Claims, 5 Drawing Sheets

NOISE GATE CONTROL CIRCUITRY FOR ELECTRONIC SYSTEMS

BACKGROUND OF THE INVENTION

1. Field of the Invention

The present invention relates to noise gate control circuitry for electronic systems. More particularly, the present invention relates to noise gate control circuitry for audio systems which eliminates the turn on and turn off effects on speakers.

2. Description of the Related Art

It is often the case when electronic systems are able to render intended disturbances, that there are times when the rendering of unintended disturbances is affected such as when power is applied or removed from the electronic system, or at times when no disturbing effects are desired. For example, a car stereo system produces a disturbance via electronic circuitry that human hearing responds to. However, any disturbance not related to the desired sound program can be vexing to the listener. For example, sounds often occur when the system is turned on and off, and often johnston hiss noises and engine noises can be heard through the speakers when the program signal level drops low enough.

Currently, devices exist which interrupt or attenuate signals when their signal levels drop below given thresholds. In this way, when the program source signal drops to a level low enough that such undesirable noises dominate, the signal is automatically muted or attenuated. However, none of these devices act on the electrical connection between the transducer of a speaker and the source of electrical excitation. Typically these devices respond to the signal level of the source signal after it has been averaged by a low pass filter. Upon responding, some of these devices shift the level at which their state of response changes so as to delay further response until significant enough changes in level for a long enough period of time are sensed. These delays vary with the level of the signal and thus often compromise the desired results.

Devices also exist which connect transducers to a source of electrical excitation only after a delay when a remote power control signal is detected. In this way any turn on transients that might exist in the electrical power source will be avoided until the power source settles to its normal operating state. However, None of these devices coordinate the disconnect of the transducer and the remote turnoff control of the transducer's power source.

SUMMARY OF THE INVENTION

The current invention coordinates the electronic switching of transducers to their power sources in accordance with a remote turn on control signal and coordinates this action with the application of power to power sources and signal processing circuitry via remote turn on provisions.

In addition, the current invention senses and responds to the signal and rapidly connects and disconnects the transducer when the signal level drops to a level too low to be of any good effect. This action is accomplished in a novel manner that improves upon the manner implemented by prior art.

The present invention also removes the effect of signal level on delays provided for suppressing undesirable changes in response in a manner which improves upon the prior art.

BRIEF DESCRIPTIONS OF THE DRAWINGS

DETAILED DESCRIPTION OF THE PREFERRED EMBODIMENT

Figure 1:
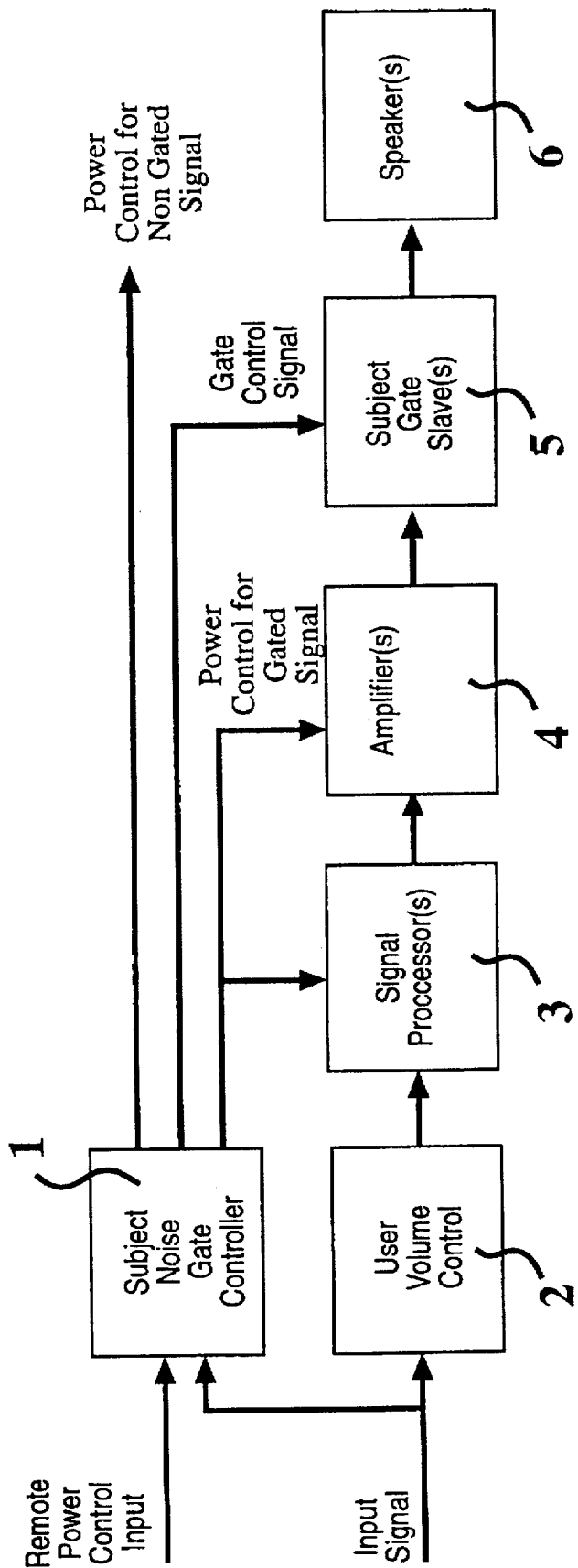
FIG. 1 is a block diagram of an exemplary audio reproduction system which includes the noise gate controller circuitry of the present invention.

FIG. 1 illustrates the utilization of the noise gate control circuitry of the present invention in a typical audio reproduction system. The input signals are representative of audio signals which are sensed by the noise gate controller 1 and user volume control 2. Signal Processor 3 and Amplifier 4 determine the electrical power excitation for the transducer of speakers 6. Noise gate slave switch 5 which is part of the noise gate control circuitry of the present invention, determines the application or removal of power from amplifier 4 to speakers 6. Noise gate controller 1 also determines power controls for signal processor(s) 3 and amplifier(s) 4 in such a manner as to eliminate turn on and turn off effects in speaker 6. Controller 1 also determines power control signals for amplifiers that may not use switch 5 to interrupt the flow of power between a given amplifier and speaker.

Figure 2:
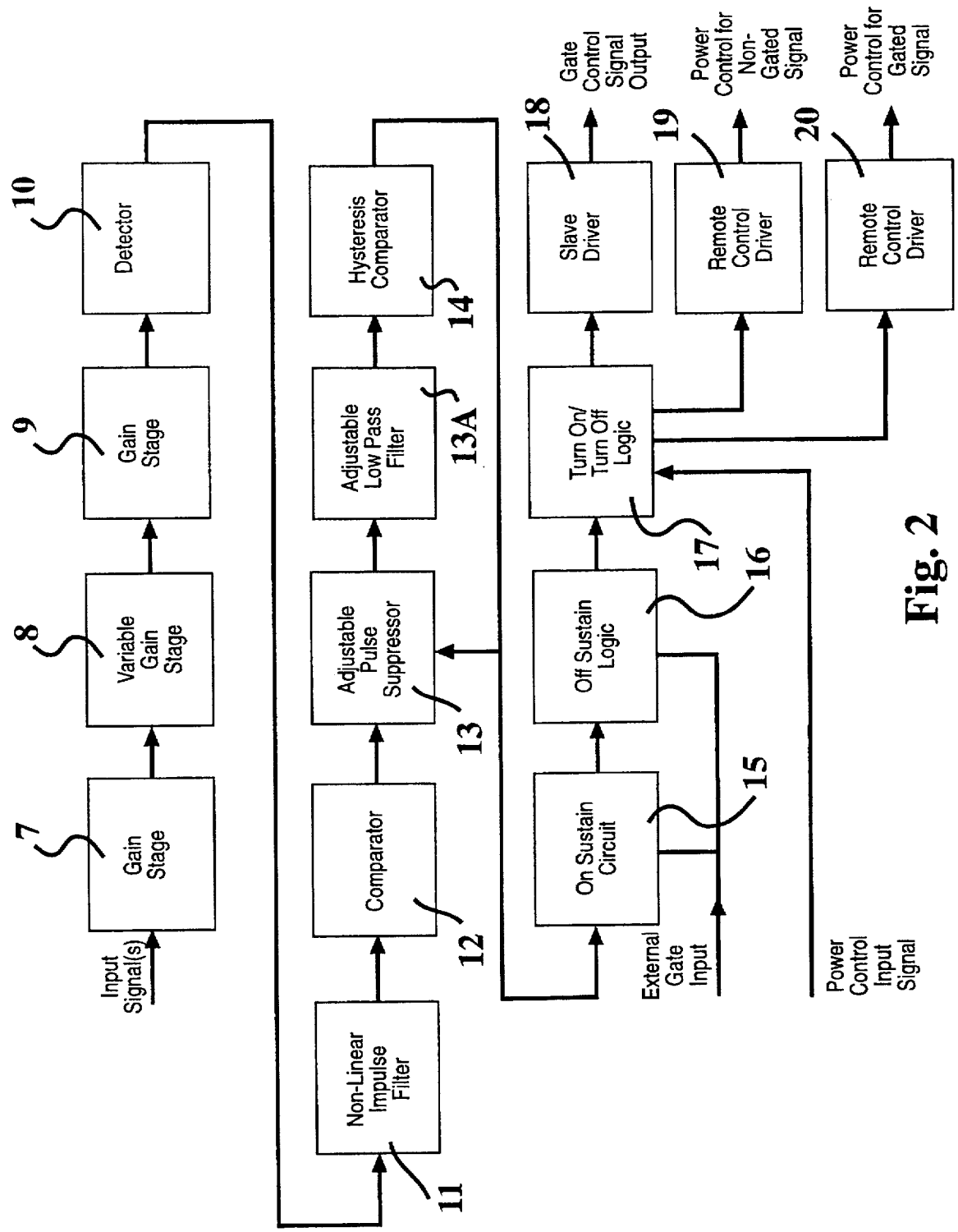
FIG. 2 is a block diagram of the noise gate controller circuitry of the present invention.

With reference to FIG. 2, the input signal is applied to an optional gain stage 7 to amplify the signal to enable circuit operation about low signal levels. Variable gain stage 8 provides for the adjustment of the sensitivity of the overall device in order to provide for higher signal levels for subsequent processing circuits. Gain stage 9 provides additional gain and the opportunity for additional response filter tailoring. By employing three separate gain stages higher overall attainable gain with lower gain inaccuracies and drifts are possible.

Figure 3:
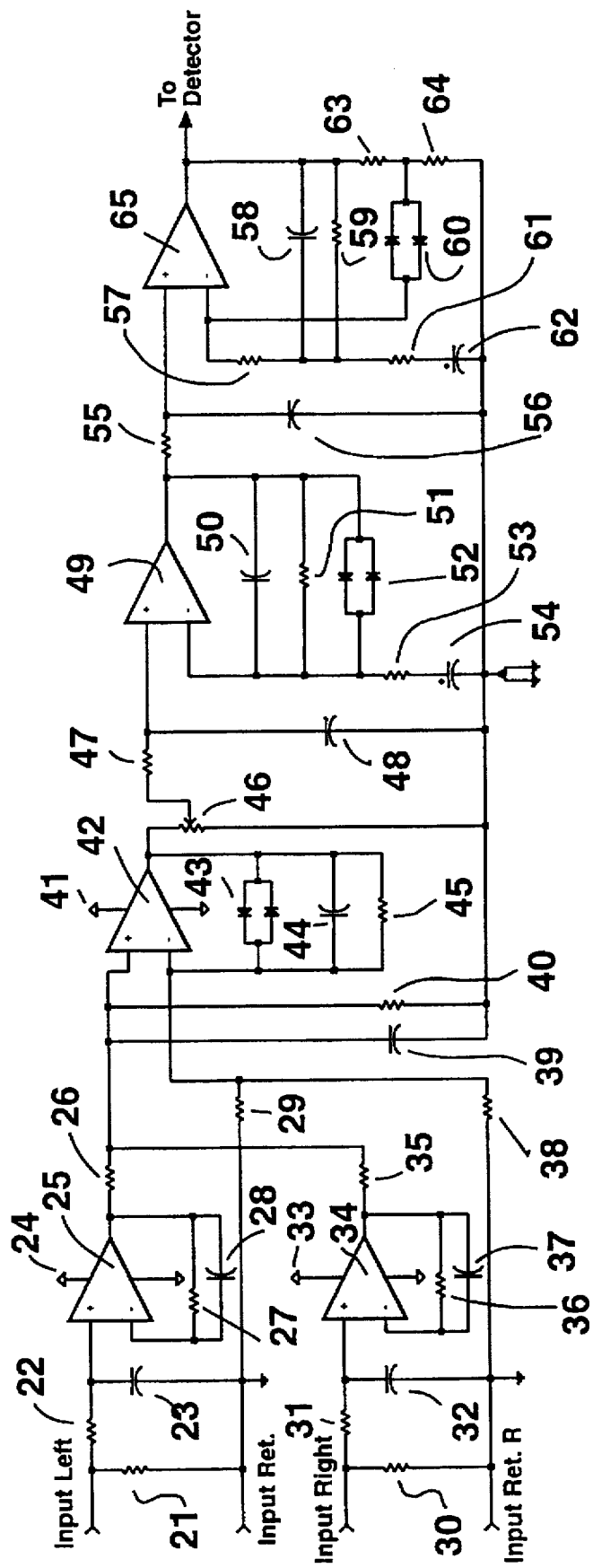
FIG. 3 is an electronic schematic diagram of the gain stage, variable gain stage and second gain stage circuitry shown in FIG. 2.

With reference to FIG. 3 the circuitry for each gain stage is shown. Source left and right signals are applied across resistor 21 and resistor 30. Resistor 22 and Capacitor 23 combine to filter high frequency noise interference in the left channel in the same manner as resistor 31 and capacitor 32 do in the right channel. Operational amplifier 25 and 34 buffer said inputs in order to provide accurate, low source impedance signals that can be accurately summed by the summing amplifier consisting of operational amplifier 42 and resistors 26,35,40,29,38 and 45. It is noted that resistors 29 and 38 are not separately required except that in this instance the inputs are isolated to avoid the possibility of interference currents between there ground connections which may be caused, for example, by the impression of stray magnetic fields upon the input cable conductors. As such two resistors, 29 and 38, sum the ground voltage reference potentials of the two inputs simultaneously.

In addition, operational amplifier 42 in conjunction with diodes 43 limits the sum calculation to about 0.6 volts peak-to-peak to prevent excess drive and overload from affecting the response of succeeding gain stages. Potentiometer 46 provides for a gain adjustment in advance of the threshold detection circuitry. In this way the threshold detection electronics that follow need only work about a given fixed level. Hence timing errors and inaccuracies are also fixed to a large degree. Threshold of sensitivity, therefore, is inversely related to the position of the potentiometer. For example, potentiometer positions which are high will yield higher sensitivities, but effect the lowest thresholds of sensitivity. Conversely, potentiometer positions which are low will yield lower sensitivities, but effect the highest threshold of sensitivity. At the full minimum position it is impossible to trigger the circuits as no significant signal will pass on to the detector circuitry.

Continuing to refer to FIG. 3, operational amplifier 49 implements the first stage of the pre-compensation and AC gain circuit. Resistor 47 and capacitor 48 provide additional high frequency interference filtering while capacitors 50 and 54 with resistors 41 and 53 provide for high AC gain that is tailored to result in an overall responsivity that approximates the relative sensitivity versus frequency of the human ear at low listening levels. Diodes 52 limit the output voltage of the operational amplifier and so provide for rapid charging and discharging of capacitor 54 to make high speed recovery from overloads in that circuit possible. The combination of resistor 53 and capacitor 54 provide for an approximate 6 db per octave roll off that begins the optimum response tailoring at low frequencies. Resistor 51 and capacitor 50 provide for an approximate 6 db per Octave roll off at high frequencies to appropriately tailor the response for those frequencies.

Operational amplifier 65 similarly determines the required response tailing. Like the previous gain stage, resistor 61 and capacitor 62 provide additional 6 db per octave low cut filtering to achieve an approximate 12 db per octave low cut filtering in combination with the effects of the previous stage in order to simulate the more dramatic drop-off of human hearing sensitivity at low levels and low frequencies. Diodes 60 like diodes 52 provide voltage limiting characteristics that prevent capacitor 62 from charging out of the range in which the gain of the circuit operates optimally.

Figure 5:
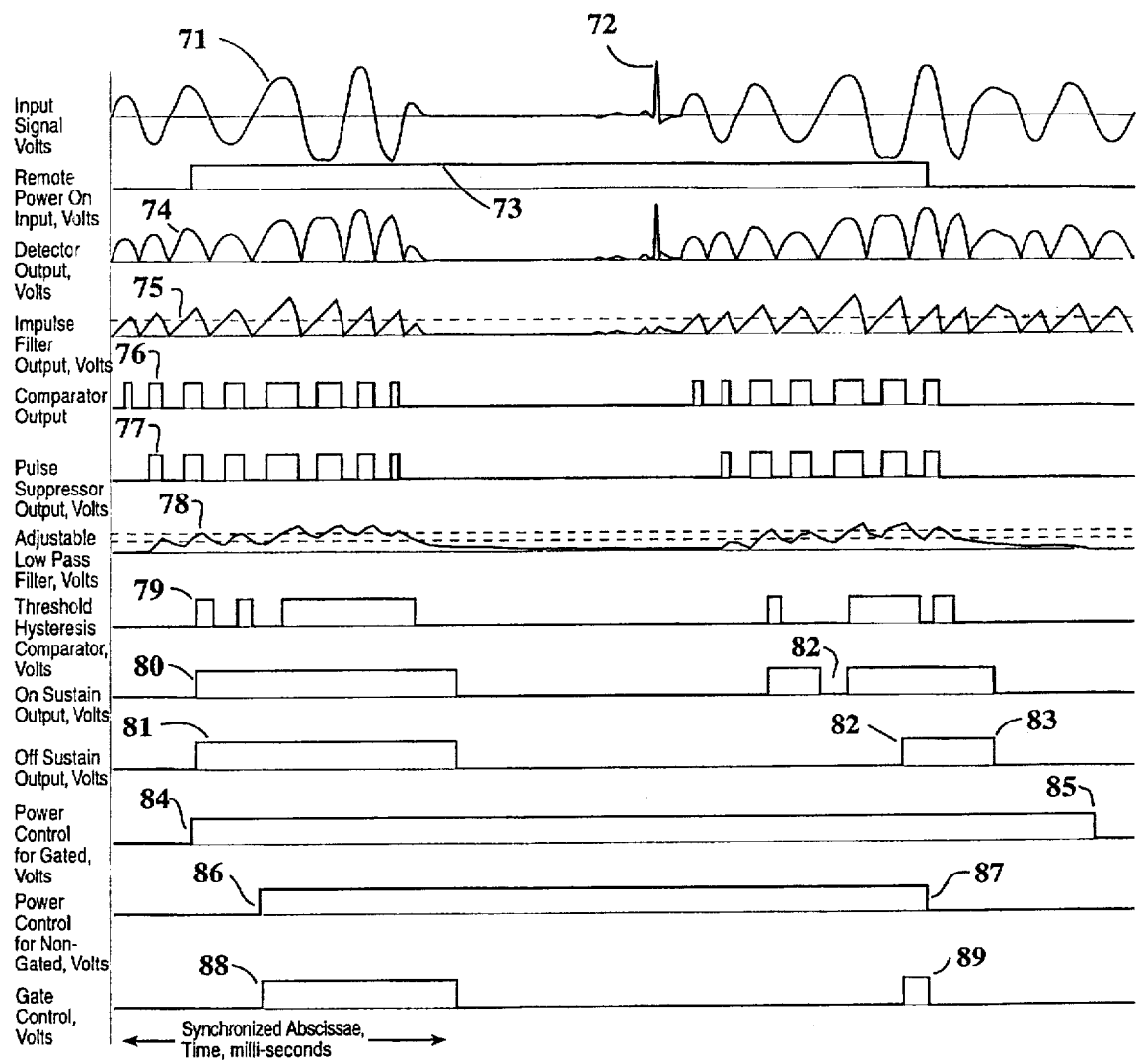
FIG. 5 is a timing diagram for the noise gate controller circuitry.

Referring to FIGS. 2 and 5, a signal detector 10 is employed which may consist of a simple diode detector or a modern operational amplifier based precision full wave rectifier. Such a circuit will convert an input signal such as is illustrated by waveform 71 in FIG. 5 to a waveform of the type indicated by waveform 74. The result of the detector circuit is a uni-polar signal which is an indicator of the level of the signal.

As shown in waveform 71 of FIG. 5, exemplary signal waveform 71 includes a large interference spike 72 not unlike that frequently encountered in practice, and which has an undesirable effect on the system performance under ordinary circumstances. To avoid this undesirable effect, the noise gate controller 1 of the present invention includes a non-linear impulse filter 11. Non-linear impulse filter 11 has the characteristic of responding with a maximum rate of rise while the fall rate is not as severely limited. As a result, the effect of the limited rate of rise can be seen on the output of the filter circuit as shown in waveform 75 of FIG. 5. The impulse filter 11 may be implemented with a diode driving a shunt capacitor whereas the diode only conducts when the signal is falling. A resistor across the diode would determine the rise rate while the fall rate is limited only upon the diode characteristic and the impedance of the source driving it. Other implementations with greater precision such as those using operational amplifiers to eliminate the inherent voltage drop of the diode are known in the art.

The output of filter 11 is converted to a digital form by analog comparator 12, shown in FIG. 2. As shown in waveform 76 of FIG. 5, the comparator output responds to the level of impulse filter output 75 whenever this input crosses the comparator threshold as indicated by the dotted line.

After conversion to a digital pulse format, pulse compressor 13 counts the comparator output pulses and is employed to provide yet further precautions against false triggers due to interference noises such as spike 72 shown in waveform 71. Considering that the desired signal consists of many repetitions, pulse suppressor counts these repetitions and ignores a given count since the expiration of the last trigger event. It may be noted that the comparator 12 signal output illustrate by wave form reference 76 is stripped of the first pulse in each of the two pulse trains as shown by reference 77. This circuit may be implemented in a multitude of fashions. Since it is a completely digital circuit it may be implemented by digital counters, although the preferred method would be an analog pulse to staircase generator followed by a comparator with an adjustable threshold voltage to permit the simple implementation of a potentiometer controllable count. It may be noted that the count performed by this circuit must be reset in preparation for the next pulse inhibition cycle. As a result, the diagram of FIG. 2 shows the output of the hysteresis comparator 14 providing for this reset function.

In addition, the preferred embodiment includes a low pass filter 13A which provides for a degree of delay and additional noise immunity. The output of low pass filter 13A is transferred to hysteresis comparator 14 as shown in FIG. 2. Preferably, comparator 14 converts the undulations of the low pass filter to digital form in a way that results in a faster rise than fall in order to result in longer on state sustains as compared to off state sustain times when subject to normal signals. This is simply accomplished with hysteresis thresholds that are a small fraction of the voltage serving the low pass filter. When operating in the vicinity of smaller voltages such comparator circuits have much faster rise times than fall times. Since the fall times will relate to the on state sustain times, and the rise times relate to the off state sustain time in this instance, it should be apparent to those skilled in the art that such an effect is easily accomplished.

FIG. 5 illustrates the output waveform 78 of low pass filter 13A and the pair of doted lines illustrate the hysteresis threshold pairs which yield the waveform shown in waveform 79. It should be noted that a desirable reduction in the transition of states has occurred in the digital signal thus arrived at.

At this point the signal is processed with digital time domain analog circuits 15 and 16 that first extend the on time of the signal by a specified amount via on sustain circuit 15. In this way unwanted spurious transitions such as those illustrated at the beginning of the waveform 79 of FIG. 5 are effectively eliminated at the cost of extending the on state time of the control. It should be noted that some unwanted spurious transitions still occur at 82 in the example illustration of FIG. 5.

Following the extension of the on state time, a similar circuit is employed to provide for a programmed extension to the off state time via off sustain circuit 16. Off sustain circuit 16 is provided to prevent the activation of the attenuation circuit until a fixed time has elapsed whereby the preceding circuits are able to arrive at more a steady state before their indications affect the state of the attenuating circuit. The advantages of these fixed sustain times may be thought of as time guard bands that permit the previous circuits to settle. Alternatively, these times may be regarded as time domain hysteresis that prevents spurious state transitions within given minimum time intervals. In this way the transducers could never be gated faster than would be tolerated.

In addition to processing the signals in a manner described above, the present invention may include logic which coordinates operation of the noise gate control circuitry with the application and removal of system power so as to minimize any undesirable consequences to the transducer and the physical environment it is directed to, and is provided in turn on/turn off logic 17. Accordingly, the present invention includes turn on/turn off logic 17 for determining the power states of the transducer amplifier 4, controlled by the attenuating gate 90 as it relates to any signal processors or sources and the action of the noise gate controller. By sustaining the application of power to the source, and hence removing the power only after the attenuating gate has closed, power removal interference will not affect the transducer. Likewise, by delaying the release of the attenuating gate until after the related circuitry has settled down, the turn on/turn off logic 17 will do the same, i.e. will not affect the transducer, for any power on interference. Such an arrangement of timing provides a guard band of time separating the effects of the application and removal of power from the active intervals of the transducer. These timing relationships are shown at 84 and 85 in FIG. 5, where the immediate turn on and delayed turn off logic is illustrated, and at 86 and 87 where the delayed turn on logic is generated, which signal is logically ANDed with the results of the off sustain output waveform 81 to yield the final gate control output shown at 88 and 89 of FIG. 5.

Figure 4:
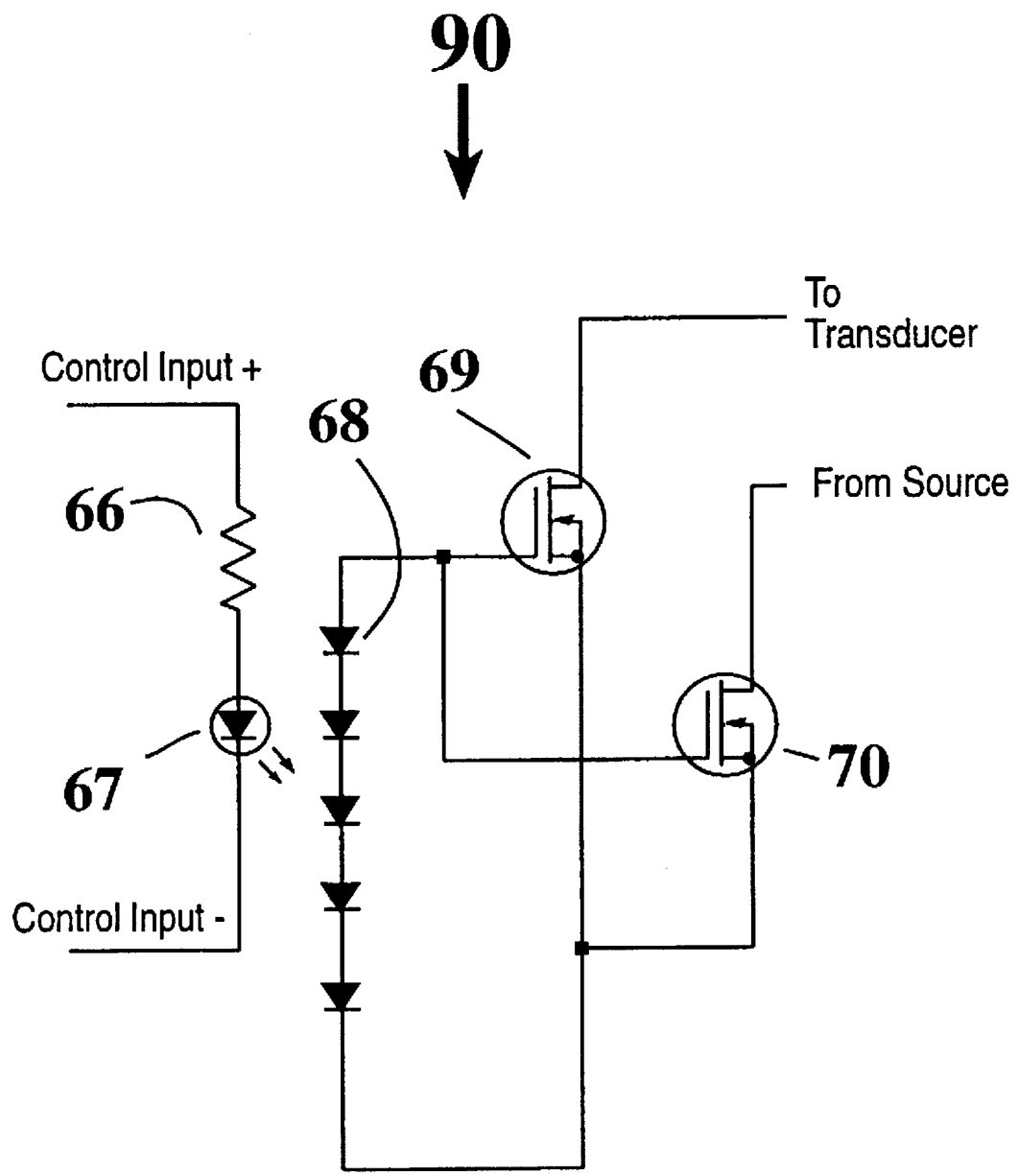
FIG. 4 is an electronic schematic diagram of the attenuating circuitry included in the noise gate slave circuitry of FIG. 1.

Driver circuits 18, 19 and 20 of FIG. 2 provide for gate control signals, power control for signal path devices with gates, and power control for signal paths that are not equipped with attenuating gates, respectively. The gate control driver circuit 18 of FIG. 2 drives the light emitting diode 67 of the attenauting gate 90, shown in FIG. 4. Light emitting diode 67 thus eliminates diodes 68 which generate the voltage and energy necessary to fully engage power, MOSFETs 69 and 70. In this way power currents can flow freely between the transducer and the source bi-directionally when the subject attenuating gate 90 is engaged. Other methods of higher speed may be adopted which provide for greater power to more rapidly charge and discharge the MOSFET gates as may occur to those skilled in the art.

It will be understood that various modifications can be made to the embodiments of the present invention herein disclosed without departing from the spirit and scope thereof. Therefore, the above description should not be construed as limiting the invention but merely as exemplifications of preferred embodiments thereof. Those skilled in the art will envision other modifications within the scope and spirit of the present invention as defined by the claims appended hereto.

What is claimed:

1. A switching apparatus comprising:
   attenuating means for controlling a second apparatus;
   means, responsive to a control signal, for setting a condition of the attenuating means to provide an input signal or power to the second apparatus; and
   means for generating the control signal to interrupt the input signal or power to the second apparatus including:
   means for responding to a level of a signal that is subjected to said attenuating means, with the signal level exceeding a threshold for generating the control signal; and
   means for applying the control signal to coordinate the application and release of the action of said attenuating means as the condition of the attenuating means in accordance with an externally applied input signal that provides for the remote control of power on and power off of the second apparatus providing the signal that is subjected to the attenuating means.

2. The switching apparatus according to claim 1 wherein said coordinating means engages said attenuating means immediately upon the receipt of said signal indicative of system power down.

3. The switching apparatus according to claim 1 wherein said coordinating means disengages said attenuating means after a specified period of time has elapsed since the receipt of said signal indicative of system power up.

4. The switching apparatus according to claim 1 further comprising means for providing a signal output which output responds immediately upon application of said signal indicative of system power up.

5. The switching apparatus according to claim 4 wherein said means for providing a signal output responds after a specified period of time, to the release of said signals indicative of system power up.

6. The switching apparatus according to claim 1 further comprising means for providing an output signal which output responds, after a specified delay, to the application of said signal indicative of system power up.

7. The switching apparatus according to claim 6 further comprising means to release said output signal immediately upon the release of said signal indicative of system power up.

8. A switching apparatus comprising:
   means for interrupting signal or power including:
   means for determining a condition of an attenuating means including means for responding to a level of a signal that is subjected to the attenuating means together with means for coordinating the application and release of the action of the attenuating means in accordance with an externally applied input signal that provides for the remote control of power on and power off of a second apparatus providing the signal that is subjected to the attenuating means;
   means for providing an output signal which output responds, after a specified delay, to the application of the input signal indicative of system power up;
   means for releasing the output signal immediately upon the release of the input signal indicative of system power up; and
   means for substantially eliminating the consumption of power upon the release of the input signal indicative of system power up.

9. A switching apparatus comprising:
   means for interrupting signal or power including:
   means for determining a condition of an attenuating means including means for responding to a level of a signal that is subjected to the attenuating means together with means for coordinating the application and release of the action of the attenuating means in accordance with an externally applied input signal that provides for the remote control of power on and power off of a second apparatus providing the signal that is subjected to the attenuating means;
   means for providing an output signal which output responds, after a specified delay, to the application of the input signal indicative of system power up;
   means for releasing the output signal immediately upon the release of the input signal indicative of system power up; and
   means for substantially eliminating the consumption of power by said device in accordance with said output signal determined by said device.

10. The switching apparatus according to claim 9 wherein said means for responding to the level of the signal that is subjected to said attenuation, includes means that extends, for a specified time duration, the period before application of said attenuation.

11. The switching apparatus according to claim 10, wherein said means for responding to the level of the signal that is subjected to said attenuation includes means that extends, for a specified time duration, the period of said attenuation.

12. The switching apparatus according to claim 11, further comprising means to adjust the level of the input signal necessary to initiate the application or release of said attenuation.

13. The switching apparatus according to claim 12, further comprising means to determine the release of said attenuation based upon the amplitude of said signal.

14. The switching apparatus according to claim 13, further comprising means to determine the release of said attenuation based upon the amplitude of a signal which is equalized, processed or filtered in accordance with the subject of said attenuation.

15. The switching apparatus according to claim 14, further comprising means to sustain the period of said attenuation for a specified period of time.

16. The switching apparatus according to claim 15, further comprising means to sustain the period of the release of said attenuation for a specified period of time.

17. The switching apparatus according to claim 16, further comprising means that respond to threshold(s) that shift in accordance with the state of said attenuating means.

18. The switching apparatus according to claim 17, wherein said means for determining the state of said attenuation means responds to said shifting threshold levels in a manner that results in substantially greater turn on sustain delay than turn off sustain delays.

19. The switching apparatus according to claim 18, wherein said means for determining the state of said attenuating means includes means to suppress the effect of spurious glitch pulses(s) not intended to effect the state of said attenuation based upon averaging the levels of said attenuation means responds to.

20. The switching apparatus according to claim 19, wherein said means for determining the state of said attenuation means further comprising means that respond less readily to rising signal levels than to falling signal levels.

21. The switching apparatus according to claim 20, wherein said means for determining the state of said attenuating means further comprising means to suppress the effect of a given number of pulses(s) not intended to effect the state of said attenuation based upon ignoring a given number of pulses.

22. The switching apparatus according to claim 21, wherein said means for determining the state of said attenuating means includes an adjustable gain stage before said means to permit the operation of said means about fixed electrical levels.

23. The switching apparatus according to claim 22, wherein said means for determining the state of said attenuating means includes diodes configured to limit the operating voltages and simultaneously provide for the rapid determination of capacitor charge levels.

24. The switching apparatus according to claim 23, further comprises means to apply said attenuation comprising a solid state electronic means.

25. The switching apparatus according to claim 24 wherein said solid state electronic means is electrically isolated from said attenuator state determining means.

26. The switching apparatus according to claim 25 wherein said solid state electronic means is electrically isolated from said attenuator state determining means whereas the energy required for the operation of said state determining means is provided by the state determining signal itself.

27. The switching apparatus according to claim 26 wherein said coupling of said attenuate state determining signal means utilizes an opto-electronic coupling device or devices.

28. The switching apparatus according to claim 27 further comprising opto-electronic device(s) to electrically isolate said attenuator from said attenuator state determining means by using devices which also simultaneously transmit the necessary electrical energy by way of optical sources and detectors.

29. A switching apparatus comprising:
   an attenuating circuit for attenuating an applied signal to a second apparatus;
   an attenuation controller, responsive to a noise control signal, for controlling the attenuating circuit to interrupt the applied signal to the transducer;
   a noise controller for generating the noise control signal, the noise controller including:
      an activation circuit for coordinating the attenuation of the applied signal with a remote control signal that provides for the remote control of a power on state and a power off state of the second apparatus.

30. The switching apparatus of claim 29 wherein the noise controller further includes:
   a threshold circuit, responsive to an input signal exceeding a predetermined threshold, for generating the noise control signal.

31. The switching apparatus of claim 29 wherein the attenuating circuit and the attenuation controller are electrically isolated by an opto-electronic device.

* * * * *